United States Patent
Nakahara (10) Patent No.: US 8,054,106 B2
(45) Date of Patent: Nov. 8, 2011

(54) LOAD DRIVING DEVICE

(75) Inventor: Akihiro Nakahara, Kanagawa (JP)

(73) Assignee: Renesas Electronics Corporation, Kawasaki-shi, Kangawa (JP)

( * ) Notice: Subject to any disclaimer, the term of this patent is extended or adjusted under 35 U.S.C. 154(b) by 11 days.

(21) Appl. No.: 12/314,491

(22) Filed: Dec. 11, 2008

(65) Prior Publication Data

US 2009/0153225 A1    Jun. 18, 2009

(30) Foreign Application Priority Data

Dec. 14, 2007    (JP) .................................. 2007-322949

(51) Int. Cl.
*H03B 1/00* (2006.01)
(52) U.S. Cl. ....................................................... 327/108
(58) Field of Classification Search .................... 327/262
See application file for complete search history.

(56) References Cited

U.S. PATENT DOCUMENTS

| | | | |
|---|---|---|---|
| 4,691,129 A | | 9/1987 | Einzinger et al. |
| 4,931,748 A | * | 6/1990 | McDermott et al. .......... 331/1 A |
| 5,592,117 A | | 1/1997 | Nadd |
| 5,801,550 A | * | 9/1998 | Tanaka et al. ................... 326/87 |
| 2002/0171298 A1 | | 11/2002 | Chen et al. |
| 2004/0262689 A1 | * | 12/2004 | Chen et al. ..................... 257/355 |
| 2006/0061354 A1 | * | 3/2006 | Wallance et al. ......... 324/207.15 |
| 2007/0170978 A1 | | 7/2007 | Furuichi et al. |

FOREIGN PATENT DOCUMENTS

| | | |
|---|---|---|
| DE | 3827730 C1 | 12/1989 |
| EP | 0 426 103 A2 | 5/1991 |
| JP | 2007-19812 | 1/2007 |

OTHER PUBLICATIONS

European Search Report in Application No. 08021471.1-2215/2071726, dated Oct. 8, 2010.
Extended European Search Report in Application No. 08021471.1-2215/2071726, dated Feb. 15, 2011.

* cited by examiner

*Primary Examiner* — Lincoln Donovan
*Assistant Examiner* — Daniel Rojas
(74) *Attorney, Agent, or Firm* — McGinn Intellectual Property Law Group, PLLC (57) ABSTRACT

A load driving device according to an aspect of the invention may includes an output transistor connected between a power supply line and an output terminal, a load connected between the output terminal and a first ground line, a control circuit connected between a gate of the output transistor and a second ground line, the control circuit controlling turning on/off of the output transistor, and a compensation transistor that turns on when a potential of the second ground line assumes a predetermined value or higher, thereby maintaining an off state of the output transistor.

19 Claims, 11 Drawing Sheets

Fig. 1

| | OPERATION MODE | GND2 | OUT | MN1 | MN2 | T1 |
|---|---|---|---|---|---|---|
| NORMAL OPERATION | ON | 0V | SUBSTANTIAL VB | OFF | OFF | ON |
| | OFF | 0V | 0V | ON | OFF | OFF |
| ABNORMAL OPERATION | DEFECTIVE GND CONNECTION | 0V OR MORE | 0V | LEAK | ON | OFF |

| | OPERATION MODE | GND2 | OUT | MN1 | MN3 | MN4 | MN5 | MN6 | MN7 | T1 |
|---|---|---|---|---|---|---|---|---|---|---|
| NORMAL OPERATION | ON | 0V | SUBSTANTIAL VB | OFF | OFF | OFF | ON | ON | OFF | ON |
| NORMAL OPERATION | OFF | 0V | 0V | ON | OFF | OFF | OFF | OFF | OFF | OFF |
| ABNORMAL OPERATION | DEFECTIVE GND CONNECTION | 0V OR MORE | 0V | OFF | ON | ON | OFF | OFF | ON | OFF |

| | OPERATION MODE | GND2 | OUT | MN1 | MN2 | MN9 | MN10 | MN11 | MN12 | MN8 | NODE B | T1 |
|---|---|---|---|---|---|---|---|---|---|---|---|---|
| NORMAL OPERATION | ON | 0V | SUBSTANTIAL VB | OFF | OFF | OFF | OFF | ON | ON | OFF | SUBSTANTIAL 0V | ON |
| NORMAL OPERATION | OFF | 0V | 0V | ON | OFF | OFF | OFF | OFF | OFF | OFF | SUBSTANTIAL 0V | OFF |
| ABNORMAL OPERATION | DEFECTIVE GND CONNECTION | 0V OR MORE | 0V | OFF | ON | ON | ON | OFF | OFF | ON | 0V OR MORE | OFF |
| ABNORMAL OPERATION | POWER SUPPLY REVERSE CONNECTION | VB | SUBSTANTIAL 0V | OFF | OFF | OFF | OFF | OFF | OFF | ON | 0.7V | ON |

| | OPERATION MODE | GND2 | OUT | MN1 | MN9 | MN10 | MN11 | MN12 | MN7 | MN8 | NODE B | T1 |
|---|---|---|---|---|---|---|---|---|---|---|---|---|
| NORMAL OPERATION | ON | 0V | SUBSTANTIAL VB | OFF | OFF | OFF | ON | ON | OFF | OFF | SUBSTANTIAL 0V | ON |
| NORMAL OPERATION | OFF | 0V | 0V | ON | OFF | OFF | OFF | OFF | OFF | OFF | SUBSTANTIAL 0V | OFF |
| ABNORMAL OPERATION | DEFECTIVE GND | 0V OR MORE | 0V | OFF | ON | ON | OFF | OFF | ON | ON | 0V OR MORE | OFF |
| ABNORMAL OPERATION | POWER SUPPLY REVERSE CONNECTION | VB | SUBSTANTIAL 0V | OFF | OFF | OFF | OFF | OFF | OFF | ON | 0.7V | ON |

LOAD DRIVING DEVICE

BACKGROUND

1. Field of the Invention

The present invention relates to a load driving device. More specifically, the invention relates to a load driving device including an output transistor that controls power supply to a load.

2. Description of Related Art

In order to supply power from a power supply to a load such as a functional circuit or a power device, a lot of load driving devices are employed. This type of load driving device includes an output transistor which is connected between the power supply and the load and serves as a switch. The load driving device supplies the power to the load or shuts off the power, according to a conduction state of the output transistor. The load driving device may be referred to as a high-side switch. An example of such a load driving device is disclosed in Japanese Unexamined Patent Application Publication No. 2007-19812.

Figure 10:
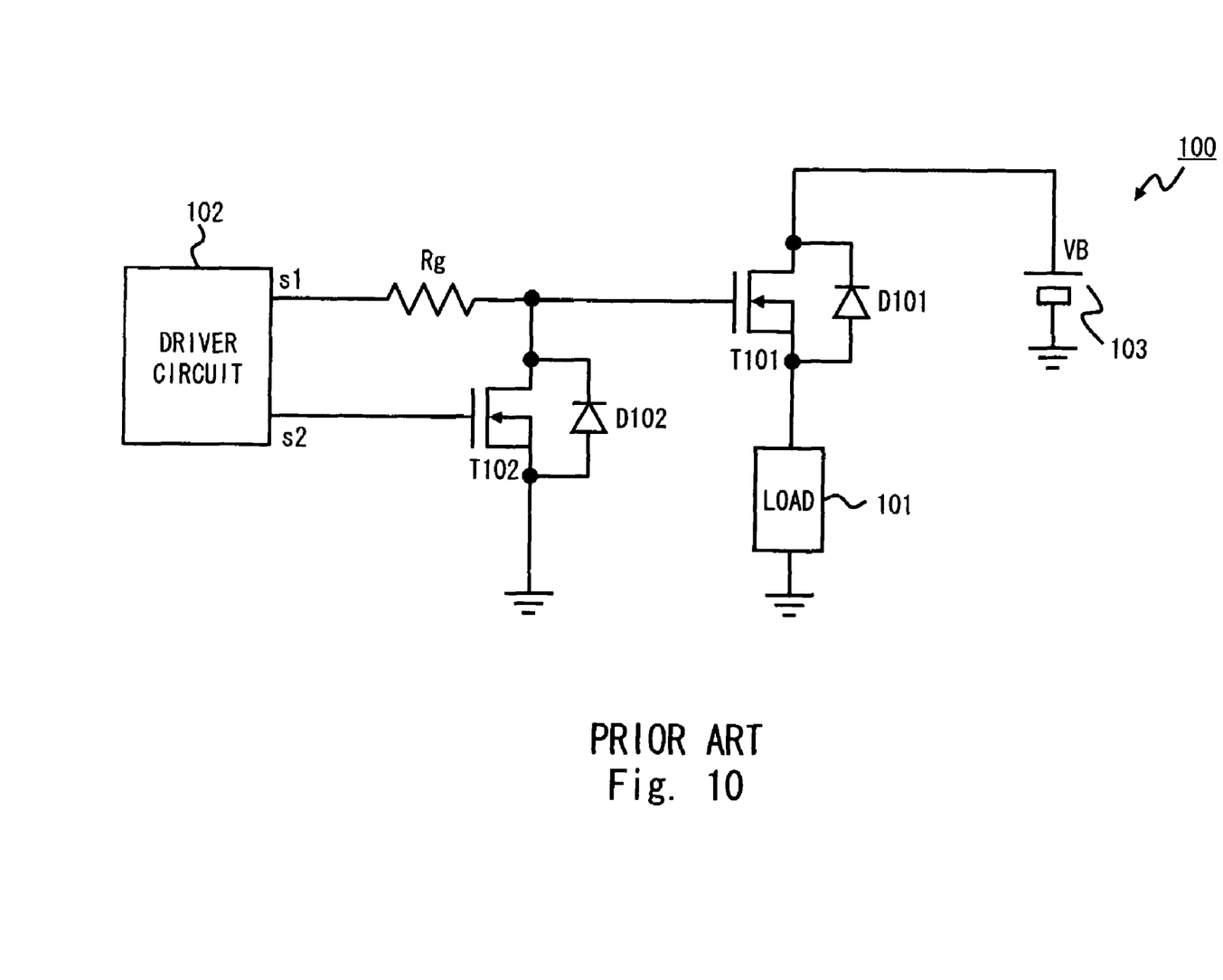
FIG. 10 is a circuit diagram of a load driving device according to a prior art.

A circuit diagram of a load driving device 100 disclosed in Japanese Unexamined Patent Application Publication No. 2007-19812 will be shown in FIG. 10. As shown in FIG. 10, the load driving circuit 100 includes a driver circuit 102, a switching N-type MOSFET (T101), and a controlling N-type MOSFET (T102). The controlling N-type MOSFET (T102) is provided between a gate of the switching N-type MOSFET (T101) and the ground. Then, the controlling N-type MOSFET (T102) is turned on or off, according to a driving signal s2 output from the driver circuit 102. When the controlling N-type MOSFET (T102) is turned off, a driving signal s1 output from the driver circuit 102 outputs a high-level signal. The switching N-type MOSFET (T101) is thereby turned on, so that power is supplied to the load 101. On the other hand, when the controlling N-type MOSFET (T102) is turned on, the gate of the switching N-type MOSFET (T101) is grounded to the ground. Thus, the switching N-type MOSFET (T101) is controlled to be turned off, so that power supply to the load 101 is shut off.

The controlling N-type MOSFET (T102) has a parasitic diode D102. An anode of the parasitic diode D102 is connected to the ground side, and a cathode of the parasitic diode D102 is connected to the gate side of the switching N-type MOSFET (T101) Thus, even when a dc power supply 103 is reversely connected, voltage is applied to the gate of the switching N-type MOSFET (T101) from the power supply 103 due to presence of the diode D102. Accordingly, the switching N-type MOSFET (T101) is turned on. For this reason, reverse connection current will not flow through a parasitic diode D101 of the switching N-type MOSFET (T101). Heat generation of the parasitic diode D101 may be thereby prevented. It means that in the load driving device 100, even when the power supply 103 is reversely connected, the switching N-type MOSFET (T101) and other circuit component may be prevented from being damaged.

SUMMARY

However, the present inventor has found the following problem. In the load driving device, a ground terminal of the load driving device may be arranged, separated from a ground terminal of the load. In such a case, a voltage difference between a ground voltage of the load driving device and a ground voltage of the load may be generated due to a resistive component of a conductor between the terminals. Further, the load driving device may be mounted on a unit, and supply of the ground voltage to the load driving device may be performed via a connector provided at the unit. In such a case, due to a fault of the connector or wire disconnection, the ground voltage may not be supplied to the load driving device. More specifically, the ground terminal of the load driving device may be opened.

Figure 11:
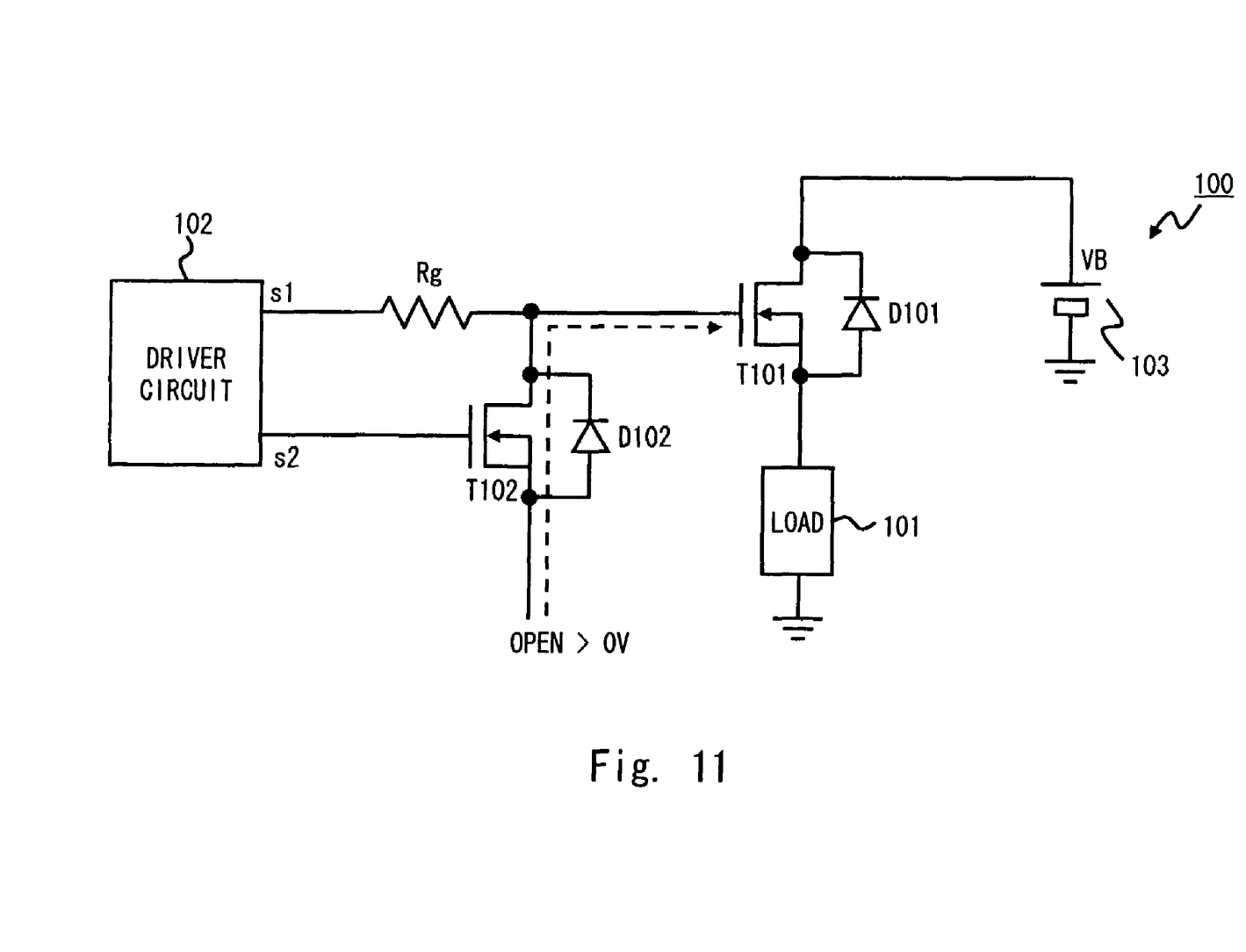
FIG. 11 is a circuit diagram to explain the problem in the load driving device according to the prior art.

FIG. 11 explains a problem encountered when the ground terminal of the load driving device is opened. As shown in FIG. 11, in this case, a voltage at the ground terminal in the load driving device 100 may become larger than the ground voltage (such as 0V) due to a leak current or noise within the unit. In the example shown in FIG. 11, a source voltage of the controlling N-type MOSFET (T102) rises. When the source voltage of the controlling N-type MOSFET (T102) rises, electric charges flow into the gate of the switching N-type MOSFET (T101) via the diode D102. Assume that this leak current is generated when the switching N-type MOSFET (T101) is in an off state. Then, a gate voltage of the switching N-type MOSFET (T101) rises, so that the switching N-type MOSFET (T101) is turned on. It means that, in the load driving device 100 described in Japanese Unexamined Patent Application Publication No. 2007-19812, the switching N-type MOSFET T101 cannot be turned off when the ground terminal GND becomes open. Further, assume that the switching N-type MOSFET (T101) is turned on in a state where its gate voltage has not sufficiently risen and a drain-to-source resistance of the switching N-type MOSFET (T101) is high. Then, the switching N-type MOSFET (T101) may be overheated and may be finally broken down.

A load driving device according to an aspect of the invention may includes an output transistor connected between a power supply line and an output terminal, a load connected between the output terminal and a first ground line, a control circuit connected between a gate of the output transistor and a second ground line, the control circuit controlling turning on/off of the output transistor, and a compensation transistor that turns on when a potential of the second ground line assumes a predetermined value or higher, thereby maintaining an off state of the output transistor.

The load driving device according to the present invention includes the compensation transistor that turns on when the potential of the second ground line assumes the predetermined value or higher, thereby maintaining the off state of the output transistor. In other words, even if a ground terminal of the load driving device has been opened and a voltage at the ground terminal has risen, the off state of the output transistor is maintained by the compensation transistor. For this reason, even if the voltage at the ground terminal has risen while the off state of the output transistor should be maintained, no current flows between a drain and a source of the output transistor.

According to the load driving device of the present invention, even if the ground terminal is opened, the off state of the output transistor may be maintained. Breakdown of the output transistor due to overheating may be thereby prevented.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
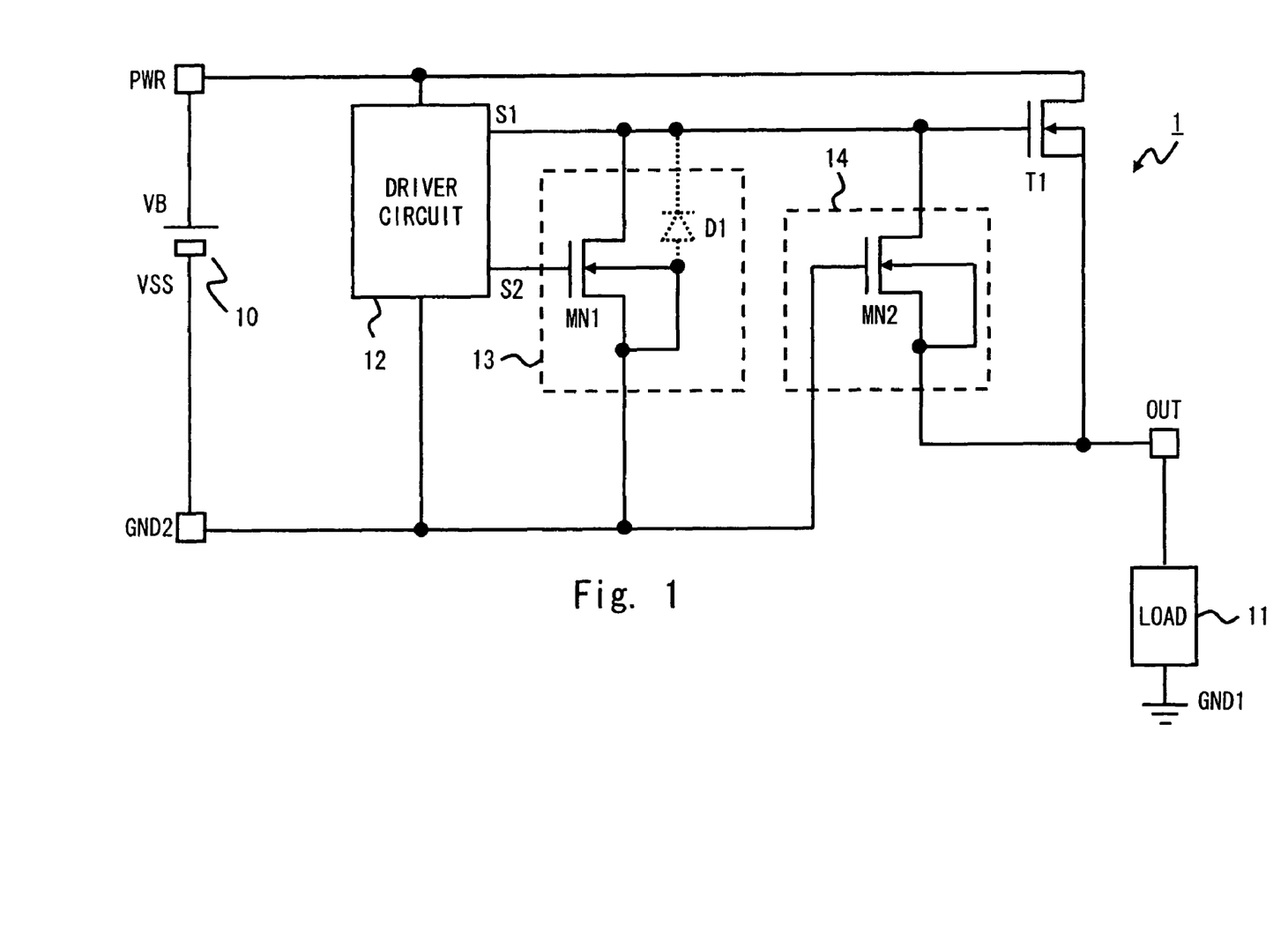
FIG. 1 is a circuit diagram of a load driving device according to a first exemplary embodiment of a present invention.

Embodiments of the present invention will be described below with reference to drawings. FIG. 1 shows a circuit diagram of a load driving device 1 according to a first embodiment of the present invention. As shown in FIG. 1, the load driving circuit 1 includes a power supply 10, a load 11, and a driver circuit 12, a control circuit 13, a compensation circuit 14, an output transistor T1, a power supply terminal PWR, a ground terminal GND1, a ground terminal GND2, and an output terminal OUT. The following description will be given, assuming that to the power supply terminal PWR, a power supply line is connected, to the ground terminal GND1, a first ground line is connected, and to the ground terminal GND2, a second ground line is connected. The driver circuit 12, the control circuit 13, the compensation circuit 14, the output transistor T1, the power supply terminal PWR, the ground terminal GND2, and the output terminal OUT may be provided by a single semiconductor device, a printed circuit board using a plurality devices, or the like.

The power supply 10 is connected between the power supply terminal PWR and the ground terminals GND1 and GND2. At a time of normal connection, the power supply 10 supplies a positive-polarity-side voltage VB to the power supply terminal PWR and a negative-polarity-side voltage VSS to the ground terminal GND2. The load 11 is connected between the output terminal OUT and the ground terminal GND1. The load 11 is a function circuit or a power device, for example, and is a power supply destination in the load driving device 1.

The driver circuit 12 is the control device of the load driving device 1. The driver circuit 12 supplies a control signal S1 to a gate of the output transistor T1, and supplies a control signal S2 to the control circuit 13. In this embodiment, it is assumed that the control signals S1 and S2 are signals that are opposite to each other in phase. The driver circuit 12 controls a conduction state of the output transistor T1 according to the control signals S1 and S2.

The control circuit 13 is connected between the gate of the output transistor T1 and the ground terminal GND2, and is controlled by the driver circuit 12. The control circuit 13 draws electric charges from the gate of the output transistor T1 when the control signal S2 goes high. When the control signal S2 goes low, the control circuit 13 is turned off, and does not draw the electric charges from the gate of the output transistor T1.

More specifically, the control circuit 13 includes a discharge transistor MN1. In this embodiment, an N-type MOS transistor is used for the discharge transistor MN1. A drain of the discharge transistor MN1 is connected to the gate of the output transistor T1. The control signal S2 is supplied to a gate of the discharge transistor MN1, and a source of the discharge transistor MN1 is connected to the ground terminal GND2. Then, a back gate of the discharge transistor MN1 is connected to the source of the discharge transistor MN1. The discharge transistor MN1 includes a parasitic diode D1 between the back gate thereof and the drain thereof. When a source voltage of the discharge transistor MN1 is higher than a drain voltage of the discharge transistor MN1, the parasitic diode D1 is turned on. When the source voltage becomes higher than the drain voltage by 0.7V or higher, the parasitic diode D1 is turned on.

The compensation circuit 14 is connected between the gate of the output transistor T1 and the output terminal OUT. The compensation circuit 14 causes a short circuit between the gate of the output transistor T1 and the output terminal OUT when a voltage at the ground terminal GND2 is higher than a predetermined voltage. It means that, by causing the short circuit between the gate of the output transistor T1 and the output terminal OUT, the compensation circuit 14 maintains an off state of the output transistor T1. More specifically, the compensation circuit 14 includes a compensation transistor MN2. In this embodiment, an N-type MOS transistor is employed for the compensation transistor MN2. A drain of the compensation transistor MN2 is connected to the gate of the output transistor T1, a source of the compensation transistor MN2 is connected to the output terminal OUT, a gate of the compensation transistor MN2 is connected to the ground terminal GND2, and a back gate of the compensation transistor MN2 is connected to the source of the compensation transistor MN2.

A drain of the output transistor T1 is connected to the power supply terminal PWR, and a source of the output transistor T1 is connected to the output terminal OUT. The control signal S1 is supplied to the gate of the output transistor T1. The output transistor T1 is turned on when the control signal S1 goes high. When the control signal S1 goes low, the output transistor T1 is turned off.

Figure 2:
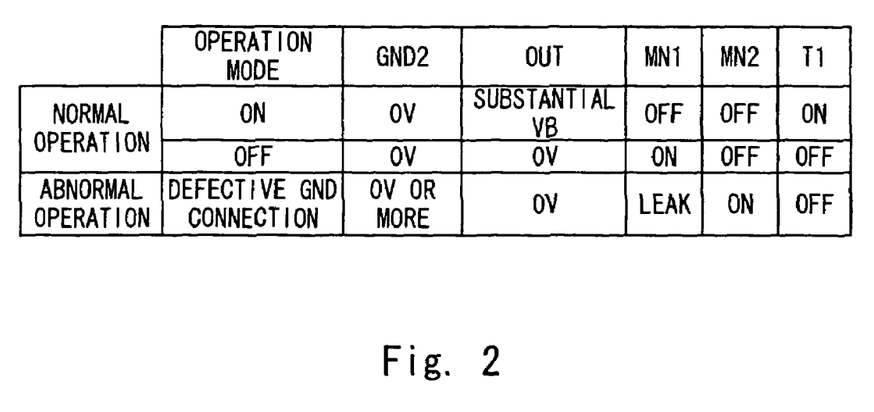
FIG. 2 is a table of the operation mode of the load drive device according to the first exemplary embodiment.

Next, on/off states of the transistors for each operation mode of the load driving device 1 will be shown in FIG. 2. Then, operations of the load driving device 1 will be described, with reference to FIG. 2. First, an operation mode in normal operation, where the output transistor T1 is turned on (hereinafter referred to as an on mode), will be described. In the on mode, the control signal S2 is low. Thus, the discharge transistor MN1 is turned off. Further, since the negative-polarity-side voltage VSS (such as 0V) of the power supply 10 is supplied to the ground terminal GND2, the compensation transistor MN2 is also turned off. On the other hand, the control signal S1 at a high level is supplied to the gate of the output transistor T1. Thus, the output transistor T1 is turned on. Accordingly, in the on mode, a voltage at the output terminal OUT assumes substantially the same value as the positive-polarity-side voltage VB of the power supply 10.

Next, an operation mode in normal operation, where the output transistor T1 is turned off (hereinafter referred to as an off mode) will be described. In the off mode, the control signal S2 is high. Thus, the discharge transistor MN1 is turned on. Further, since the negative side voltage VSS (such as 0V) is supplied to the ground terminal GND2. Thus, the compensation transistor MN2 is turned off. On the other hand, the control signal S1 at a low level is supplied to the gate of the output transistor T1. Thus, the output transistor T1 is turned off. Accordingly, in the off mode, the voltage at the output terminal OUT assumes substantially the same value as a voltage (such as 0V) at the ground terminal GND1 of the load 11.

Next, an abnormal operation mode where the ground terminal GND2 is opened due to a defective wire connection or the like (hereinafter referred to as a defective GND connection mode) will be described. It is assumed that in the defective GND connection mode, the output transistor T1 is turned off. For this reason, the output terminal OUT assumes 0V. Then, when the voltage at the ground terminal GND2 rises from 0V and assumes the value that exceeds the threshold voltage of the compensation transistor MN2, the compensation transistor MN2 turns on, and causes a short circuit between the gate of the output transistor T1 and the output terminal OUT. Further, from the discharge transistor MN1, leak current flows into the gate of the output transistor via the parasitic diode D1. The compensation transistor MN2 is, however, in an on state. Thus, this leak current is discharged to the output terminal OUT by the compensation transistor MN2. It means that a voltage increase caused by the leak current is not generated at the gate of the output transistor T1. The output transistor T1 therefore maintains the off state.

As described above, even when the voltage at the ground terminal GND2 has risen due to the defective ground wire connection in the load driving device 1 in this embodiment, the current that flows into the gate of the output transistor T1 via the parasitic diode D1 of the discharge transistor MN1 is discharged to the output terminal OUT because of turning on of the compensation transistor MN2. With such an operation, the load driving device 1 may maintain the off state of the output transistor T1 even if the voltage at the ground terminal GND2 has risen. Further, since the output transistor T1 may maintain the off state, heat generation of the output transistor T1 caused by the increase in the voltage at the ground terminal GND2 may be prevented, so that breakdown of the output transistor T1 may be prevented. It means that, reliability of the load driving device 1 at a time of a malfunction caused by a ground wire disconnection or the like may be improved.

Second Exemplary Embodiment

Figure 3:
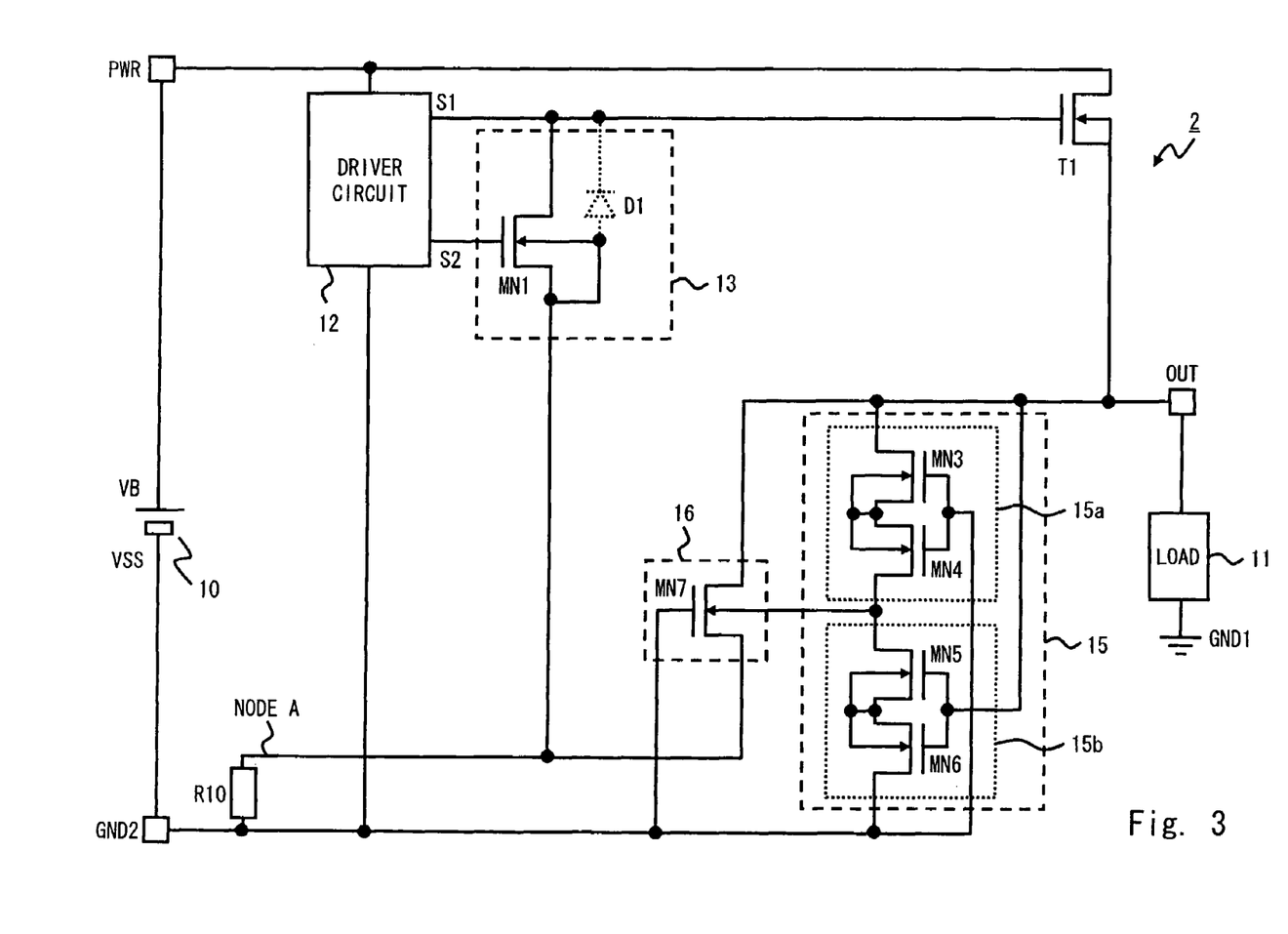
FIG. 3 is a circuit diagram of a load driving device according to a second exemplary embodiment of a present invention.

A circuit diagram of a load driving device 2 according to a second embodiment will be shown in FIG. 3. As shown in FIG. 3, the load driving circuit 2 includes the power supply 10, the load 11, driver circuit 12, the control circuit 13, a back gate control circuit 15, a compensation circuit 16, the output transistor T1, a resistor R10, the power supply terminal PWR, the ground terminal GND1, the ground terminal GND2, and the output terminal OUT. The driver circuit 12, the control circuit 13, the back gate control circuit 15, the compensation circuit 16, the output transistor T1, the resistor R10, the power supply terminal PWR, the ground terminal GND2, and the output terminal OUT may be provided by a single semiconductor device, a printed circuit board using a plurality devices, or the like. In the following description, by assigning same reference numerals to components that are the same as those in the first embodiment, description of the components will be omitted.

The control circuit 13 is the same as that in the first embodiment. However, the connecting destination of the source of the discharge transistor MN1 is different from that in the first embodiment. In the second embodiment, the source of the discharge transistor MN1 is coupled to the ground terminal GND2 via the resistor R10. In the following description, a node on the side of the source of the discharge transistor MN1 will be referred to as a node A.

The compensation circuit 16 is connected between the output terminal OUT and the node A, and causes a short circuit between the node A and the output terminal OUT when a voltage at the ground terminal GND2 is higher than a predetermined voltage. The compensation circuit 16 includes a compensation transistor MN7. In the second embodiment, an N-type MOS transistor is employed for the compensation transistor MN7. A drain of the compensation transistor MN7 is connected to the output terminal OUT, a source of the compensation transistor MN7 is connected to the node A, a gate of the compensation transistor MN7 is connected to the ground terminal GND2, and a back gate of the compensation transistor MN7 is connected to the back gate control circuit 15.

The back gate control circuit 15 is connected between the output terminal OUT and the ground terminal GND2. The back gate control circuit 15 supplies a ground potential to the back gate of the compensation transistor MN7 when a potential at the ground terminal GND2 is the ground potential. When the potential at the ground terminal GND2 becomes higher than a predetermined value, the back gate control circuit 15 supplies a potential at the output terminal OUT to the back gate of the compensation transistor. The back gate control circuit 15 includes a first switching portion 15a and a second switching portion 15b. When the voltage at the ground terminal GND2 becomes higher than the predetermined value, the first switching portion 15a is turned on, and then supplies the voltage at the output terminal OUT to the back gate of the compensation transistor MN7. The second switching portion 15b supplies a negative-polarity-side voltage VSS of the power supply 10 to the back gate of the compensation transistor MN7 when a positive-polarity-side voltage VB of the power supply 10 is supplied to the output terminal OUT.

More specifically, the first switching portion 15a includes NMOS transistors MN3 and MN4. The NMOS transistors MN3 and MN4 are connected in series between the output terminal OUT and the back gate of the compensation transistor MN7. Gates of the NMOS transistors MN3 and MN4 are both connected to the ground terminal GN2. Back gates of the NMOS transistors MN3 and MN4 are both connected to a connecting point between the NMOS transistors MN3 and MN4. Then, the first switching portion 15a is turned on when the voltage at the ground terminal GND2 becomes higher than a source voltage of the NMOS transistor MN4 by 0.7V, which is the forward bias voltage of a parasitic diode between the source and the back gate of an NMOS transistor+a threshold voltage VT of the NMOS transistor MN3.

The second switching portion 15b includes NMOS transistors MN5 and MN6. The NMOS transistors MN5 and MN6 are connected in series between the back gate of the compensation transistor MN7 and the ground terminal GND2. Gates of the NMOS transistors MN5 and MN6 are both connected to the output terminal OUT. Back gates of the NMOS transistors MN5 and MN6 are both connected to a connecting point between the NMOS transistors MN5 and MN6. Then, the second switching portion 15b is turned on when a voltage difference between a source of the NMOS transistor MN6 and the output terminal OUT becomes higher than 0.7V, which is the forward bias voltage of a parasitic diode between the source and the back gate of an NMOS transistor+the threshold voltage VT of the NMOS transistor MN5.

Figure 4:
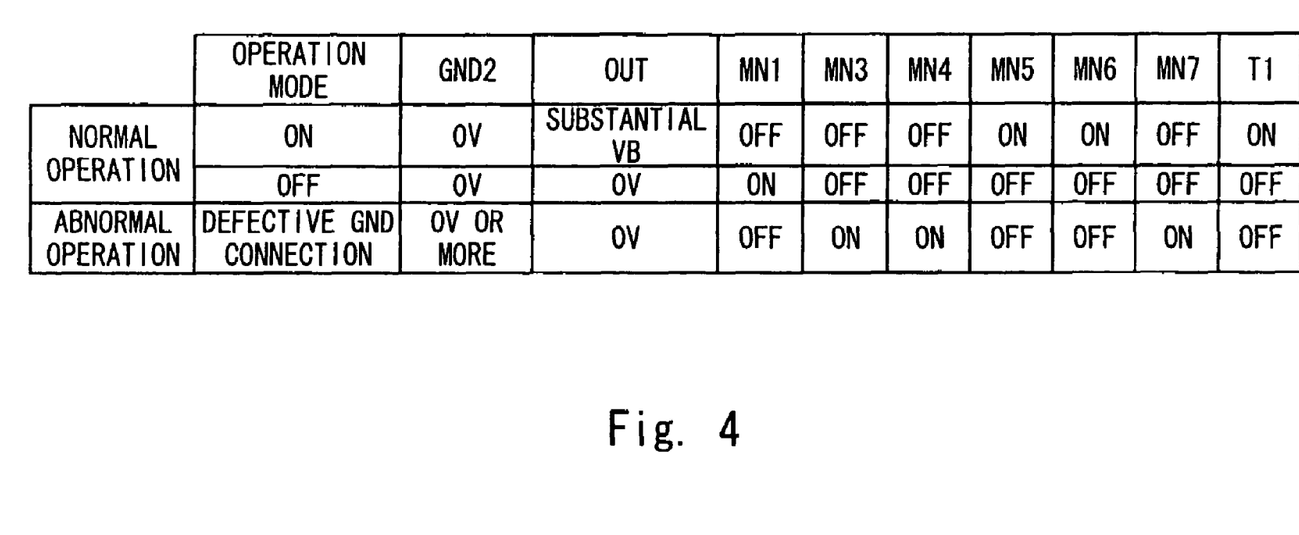
FIG. 4 is a table of the operation mode of the load drive device according to the second exemplary embodiment.

Next, on/off states of the transistors for each operation mode of the load driving device 2 will be shown in FIG. 4. Then, operations of the load driving device 2 will be described, with reference to FIG. 4. First, an on mode in normal operation, where the output transistor T1 is turned on, will be described. In the on mode, a control signal S2 is low. Thus, the discharge transistor MN1 is turned off. Further, the negative-polarity-side voltage VSS (such as 0V) of the power supply 10 is supplied to the ground terminal GND2. Thus, the compensation transistor MN7 is also turned off. On the other hand, a control signal S1 at a high level is supplied to the gate of the output transistor T1. Thus, the output transistor T1 is turned on. Accordingly, in the on mode, the voltage at the output terminal OUT assumes substantially the same value as the positive-polarity-side voltage VB of the power supply 10. Further, in the on mode, the NMOS transistors MN5 and MN6 of the second switching portion 15b are turned on, and the NMOS transistors MN3 and MN4 of the first switching portion 15a are turned off. Thus, the voltage at the ground terminal GND2 is applied to the back gate of the compensation transistor MN7. In this case, the terminal of the compensation transistor MN7 connected to the output terminal OUT serves as the drain of the compensation transistor MN7, and the terminal of the compensation transistor MN7 connected to the node A serves as the source of the compensation transistor MN7.

Next, an off mode in normal operation where the output transistor T1 is turned off will be described. In the off mode, the control signal S2 is high. Thus, the discharge transistor MN1 is turned on. Further, the negative-polarity-side voltage VSS (such as 0V) of the power supply 10 is supplied to the ground terminal GND2. Thus, the compensation transistor MN7 is turned off. On the other hand, since the control signal S1 at a low level is supplied to the gate of the output transistor T1, the output transistor T1 is turned off. Accordingly, in the off mode, the voltage at the output terminal OUT assumes substantially the same value as a voltage (such as 0V) at the ground terminal GND1 of the load 11. Further, in the off mode, the NMOS transistors MN3 and MN4 of the first switching portion 15a are turned off, and the NMOS transistors MN5 and MN6 of the second switching portion 15b are also turned off. For this reason, a voltage supplied to the back gate of the compensation transistor MN7 by the back gate control circuit 15 assumes a value equal to 0V, which is a potential between that of the output terminal OUT and that of the ground terminal GND2.

Next, a defective GND connection mode where the ground terminal GND2 is opened due to a defective wire connection or the like will be described. It is assumed that in the defective GND connection mode, the output transistor T1 is turned off. For this reason, the output terminal OUT assumes 0V. Then, when the voltage at the ground terminal GND2 rises from 0V and assumes the value that exceeds the threshold voltage of the compensation transistor MN7, the compensation transistor MN7 is turned on, and causes a short circuit between the node A and the output terminal OUT. The voltage at the output terminal OUT (such as 0V) is thereby supplied to the node A. For this reason, a source-to-drain voltage of the discharge transistor MN1 is substantially eliminated. Accordingly, no leak current flows into the gate of the output transistor T1 via the discharge transistor MN1. It means that no voltage increase due to the leak current is generated at the output transistor T1. The output transistor T1 maintains an off state. Further, in the defective GND connection mode, the NMOS transistors MN3 and MN4 of the first switching portion 15a are turned on, and the NMOS transistors MN5 and MN6 of the second switching portion 15b are turned off. For this reason, a voltage that the back gate control circuit 15 supplied to the back gate of the compensation transistor MN7 becomes the voltage of the output terminal OUT. It means that, in the defective GND connection mode, the back gate voltage of the compensation transistor MN7 assumes 0V, and the terminal of the compensation transistor MN7 connected to the output terminal OUT serves as the source of the compensation transistor MN7, while the terminal of the compensation transistor MN7 connected to the node A serves as the drain of the compensation transistor MN7.

As described above, in the load driving device 2 in the second embodiment, even when the voltage at the ground terminal GND2 increases due to the defective ground wire connection, the compensation transistor MN7 is turned on, thereby supplying the voltage at the output terminal OUT to the node A. A voltage difference generated at both ends of the discharge transistor MN1 is thereby substantially eliminated, so that the discharge transistor MN1 is turned off. The leak current that may flow into the gate of the output transistor T1 via the discharge transistor MN1 is thereby prevented. With the operation described above, the load driving device 2 may maintain the off state of the output transistor T1 even when the voltage at the ground terminal GND2 has risen. Further, since the off state of the output transistor T1 may be maintained, heat generation of the output transistor T1 due to the voltage increase of the ground terminal GND2 may be prevented, so that breakdown of the output transistor T1 may be prevented. In other words, reliability of the load driving device 2 at a time of a malfunction due to the defective ground wire connection or the like may be improved in the load driving device 2 as well.

Third Exemplary Embodiment

In the load driving devices according to the first and second embodiments, the malfunction with respect to the off state of the output transistor T1 due to the voltage increase in the ground terminal GND2 may be solved. However, when the power supply 10 is reversely connected, protection of the load driving devices cannot not be implemented. Then, in the third embodiment, in addition to solution to the malfunction with respect to the off state of the output transistor T1 due to the voltage increase in the ground terminal GND2, protection of a load driving device when the power supply 10 is reversely connected is also implemented.

Figure 5:
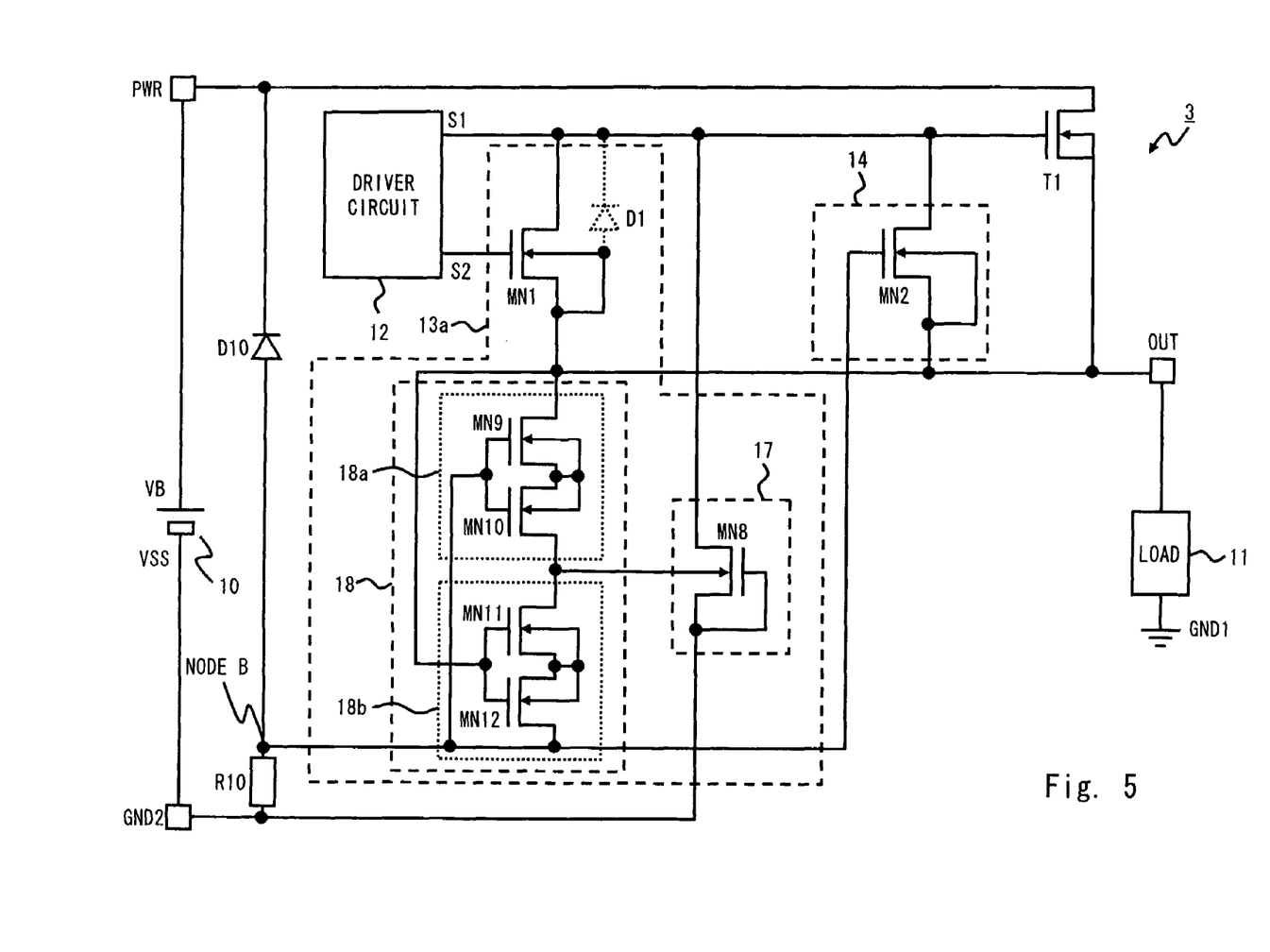
FIG. 5 is a circuit diagram of a load driving device according to a third embodiment of a present invention.

FIG. 5 shows a circuit diagram of a load driving device 3 according to a third embodiment. As shown in FIG. 5, the load driving device 3 includes the power supply 10, the load 11, the driver circuit 12, a control circuit 13a, the compensation circuit 14, the output transistor T1, a protection diode (such as a clamp diode) D10, a resistor R10, the power supply terminal PWR, the ground terminals GND1 and GND2, and the output terminal OUT. The driver circuit 12, the control circuit 13a, the compensation circuit 14, the output transistor T1, the clamp diode D10, the resistor R10, the power supply terminal PWR, the ground terminal GND2, and the output terminal OUT may be provided by a single semiconductor device, a printed circuit board using a plurality devices, or the like. In the following description, by assigning same reference numerals to components that are the same as those of the load driving device 1 in the first embodiment, description of the components will be omitted.

The resistor R10 and the clamp diode D10 are connected between the ground terminal GND2 and the power supply terminal PWR. Then, an anode of the clamp diode D10 is connected to the resistor, and a cathode of the clamp diode D10 is connected to the power supply terminal PWR. In the following description, a connecting point between the resistor R10 and the clamp diode D10 will be referred to as a node B.

The control circuit 13a is obtained by adding a reverse connection protection circuit 17 and a back gate control circuit 18 to the control circuit 13 in the first embodiment. The control circuit 13a in the third embodiment is different from that in the first embodiment in the connecting destination of the source of the discharge transistor MN1. The source of the discharge transistor MN1 in the third embodiment is connected to the output terminal OUT.

The reverse connection protection circuit 17 is connected between the gate of the output transistor T1 and the ground terminal GND2. The reverse connection protection circuit 17 includes a reverse connection protection transistor MN8. One of a source and a drain of the reverse connection protection transistor MN8 is connected to the gate of the output transistor T1, and the other of the source and the drain of the reverse connection protection transistor MN8 is connected to the ground terminal GND2, and a gate of the reverse connection protection transistor MN8 is connected to the other of the source and the drain of the reverse connection protection transistor MN8. It means that when the power supply 10 is normally connected, the reverse connection protection transistor MN8 is diode-connected. The source of the reverse connection protection transistor MN8 serves as an anode side terminal of a diode, while the drain of the reverse connection protection transistor MN8 serves as a cathode side terminal of the diode. A back gate of the reverse connection protection transistor MN8 is connected to the back gate control circuit 18. When the power supply 10 is reversely connected, the drain of the reverse connection protection transistor MN8 is connected to the ground terminal GND2, and the source of the reverse connection protection transistor MN8 is connected to the gate of the output transistor T1. The back gate of the protection transistor MN8 is connected to the back gate control circuit 18.

The back gate control circuit 18 is connected between the ground terminal GND2 and the output terminal OUT. In this embodiment, the back gate control circuit 18 is coupled to the ground terminal GND2 via the resistor R10. Then, the back gate control circuit 18 controls a back gate voltage to be supplied to the back gate of the reverse connection protection transistor MN8, based on a voltage difference between the node B and the output terminal OUT. The first switching portion 18a is turned on when a voltage at the node B becomes higher than a predetermined value, and supplies a voltage at the output terminal OUT to the back gate of the reverse connection protection transistor MN8. The second switching portion 18b supplies the voltage at the node B to the back gate of the reverse connection protection transistor MN8 when a positive polarity side VB of the power supply 10 is supplied to the output terminal OUT.

More specifically, the first switching portion 18a includes NMOS transistors MN9 and MN10. The NMOS transistors MN9 and MN10 are connected in series between the output terminal OUT and the back gate of the reverse connection protection transistor MN8. Gates of the NMOS transistors MN9 and MN10 are both connected to the node B. Back gates of the NMOS transistors MN9 and MN10 are both connected to a connecting point between the NMOS transistors MN9 and MN10. Then, the first switching portion 18a is turned on when the voltage at the node B becomes higher than a source voltage of the NMOS transistor MN10 by 0.7V, which is the forward bias voltage of a parasitic diode between the source and the back gate of an NMOS transistor+the threshold voltage VT of the NMOS transistor MN9.

The second switching portion 18b includes NMOS transistors MN11 and MN12. The NMOS transistors MN11 and MN12 are connected in series between the back gate of the compensation transistor MN2 and the node B. Gates of the NMOS transistors MN11 and MN12 are both connected to the output terminal OUT. Back gates of the NMOS transistors MN11 and MN12 are both connected to a connecting point between the NMOS transistors MN11 and MN12. Then, the second switching portion 18b is turned on when a voltage difference between a source of the NMOS transistor MN12 and the output terminal OUT becomes higher than 0.7V, which is the forward bias voltage of a parasitic diode between the source and the back gate of an NMOS transistor+the threshold voltage VT of the NMOS transistor MN11.

The compensation circuit 14 is the same as the compensation circuit 14 in the first embodiment. However, the connecting destination of the gate of the compensation transistor MN2 is different from that in the first embodiment. In the third embodiment, the gate of the compensation transistor MN2 is connected to the node B.

Figure 6:
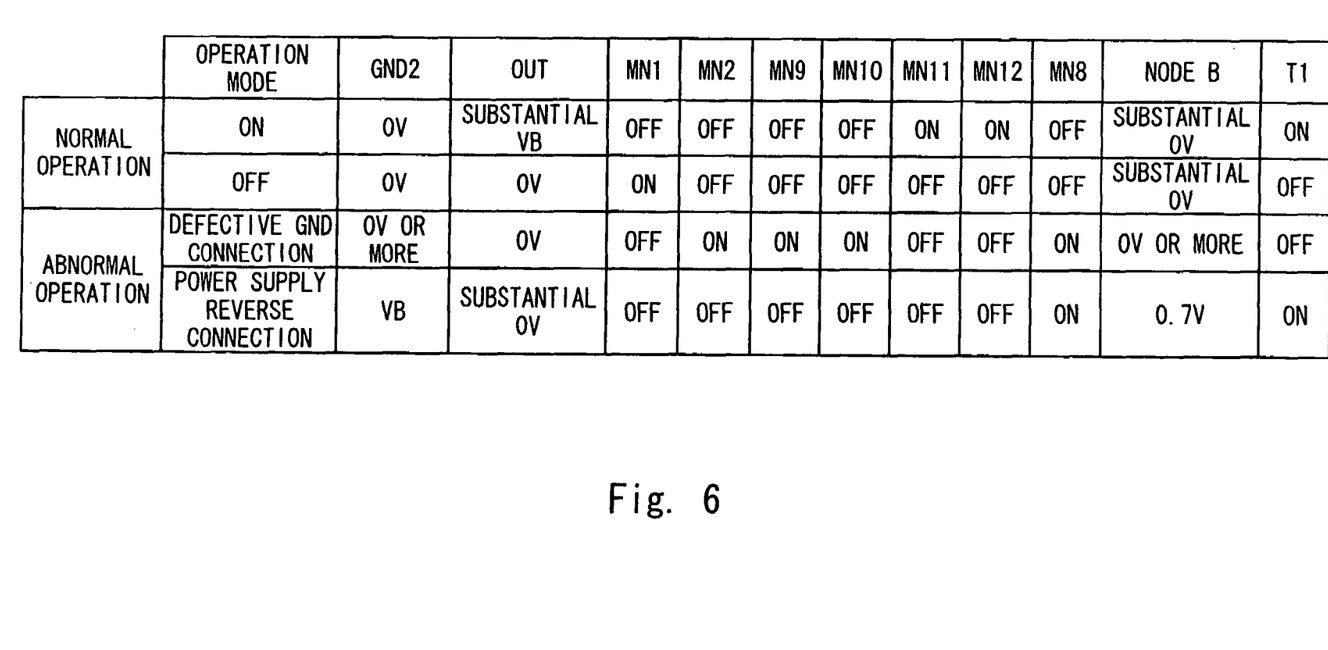
FIG. 6 is a table of the operation mode of the load drive device according to the third exemplary embodiment.

Next, on/off states of the transistors for each operation mode of the load driving device 3 will be shown in FIG. 6. Then, operations of the load driving device 3 will be described, with reference to FIG. 6. First, an on mode in normal operation, where the output transistor T1 is turned on, will be described. In the on mode, a control signal S2 is low. Thus, the discharge transistor MN1 is turned off. Further, since a negative-polarity-side voltage VSS (such as 0V) of the power supply 10 is supplied to the ground terminal GND2, the voltage at the node B also assumes approximately 0V. Thus, the compensation transistor MN2 is turned off. On the other hand, a control signal S1 at a high level is supplied to the gate of the output transistor T1. Thus, the output transistor T1 is turned on. Accordingly, in the on mode, the voltage at the output terminal OUT assumes substantially the same value as the positive-polarity-side voltage VB of the power supply 10. Further, in the on mode, the NMOS transistors MN11 and MN12 of the second switching portion 18b are turned on, and the NMOS transistors MN9 and MN10 of the first switching portion 18a are turned off. Thus, the voltage at the node B is applied to the back gate of the compensation transistor MN8. In this case, almost no current flows through the resistor R10. Thus, the voltage at the node B assumes approximately 0V. Thus, the reverse connection protection transistor MN8 is turned off.

Next, an off mode in normal operation, where the output transistor T1 is turned off, will be described. In the off mode, the control signal S2 is high. Thus, the discharge transistor MN1 is turned on. Further, the negative-polarity-side voltage VSS (such as 0V) of the power supply 10 is supplied to the ground terminal GND2. Thus, the voltage at the node B also assumes approximately 0V, and the compensation transistor MN2 is turned off. On the other hand, since the control signal S1 at a low level is supplied to the gate of the output transistor T1, the output transistor T1 is turned off. Accordingly, in the off mode, the voltage at the output terminal OUT assumes substantially the same value as a voltage (such as 0V) at the ground terminal GND1 of the load 11. Further, in the off mode, the NMOS transistors MN9 and MN10 of the first switching portion 18a are turned off, and the NMOS transistors MN11 and MN12 of the second switching portion 18b are also turned off. For this reason, a voltage supplied to the back gate of the reverse connection protection transistor MN8 by the back gate control circuit 18 assumes a value equal to 0V, which is a potential between that of the output terminal OUT and that of the node B. Thus, the reverse connection protection transistor MN8 is turned off.

Next, a defective GND connection mode where the ground terminal GND2 is opened due to a defective wire connection or the like will be described. It is assumed that in the defective GND connection mode, the output transistor T1 is turned off. For this reason, the output terminal OUT assumes 0V. Then, when a voltage at the ground terminal GND2 rises from 0V and the voltage at the node B assumes the value that exceeds the threshold voltage of the compensation transistor MN2, the compensation transistor MN2 is turned on, and causes a short circuit between the gate of the output transistor T1 and the output terminal OUT. A gate-to-source voltage of the output transistor T1 is thereby reduced to substantially 0V. For this reason, the output transistor T1 maintains an off state. Further, a voltage difference between both ends of the discharge transistor MN1 is eliminated. Thus, the discharge transistor MN1 is also turned off. In the defective GND connection mode, the NMOS transistors MN9 and MN10 in the first switching portion 18a are turned on, and the NMOS transistors MN11 and MN12 in the second switching portion 18b are turned off. For this reason, a voltage that the back gate control circuit 18 supplies to the back gate of the reverse connection protection transistor MN8 becomes the voltage at the output terminal OUT. It means that, in the defective GND connection mode, the back gate voltage of the reverse connection protection transistor assumes 0V. For this reason, the back gate voltage of the reverse connection protection transistor MN8 is low. Further, a potential higher than a gate voltage of the output transistor T1 is applied to a ground potential GND2 of the reverse connection protection transistor MN8. Thus, the reverse connection protection transistor MN8 is turned on. A drawing current flows through the reverse connection protection transistor MN8 from ground potential GND2 to the gate of the output transistor T1, the drawing current is discharged to the output terminal OUT through the compensation transistor MN2. Thus, the off state of the output transistor T1 is maintained.

Next, a reverse connection mode in abnormal operation, where the power supply 10 is reversely connected, will be described. In the reverse connection mode, the positive-polarity-side voltage VB of the power supply 10 is applied to the ground terminals GND1 and GND2. On the other hand, the negative-polarity-side voltage VSS (such as 0V) of the power supply 10 is applied to the power supply PWR. A voltage at the output terminal OUT becomes the voltage at the power supply terminal PWR via a parasitic diode of the output transistor T1, which is formed between a back gate and a region connected to the power supply PWR side. Thus, the output terminal OUT assumes approximately 0.7V, for example, which is a forward bias voltage of the parasitic diode of the output transistor T1. In the reverse connection mode, the clamp diode D10 is forwardly biased. Thus, the voltage at the node B assumes approximately 0.7V. Further, the positive-polarity-side voltage VB of the power supply 10 is applied to the anode side terminal of the reverse connection protection transistor MN8 from the ground terminal GND2. For this reason, the reverse connection protection transistor MN8 operates like a diode that has been forwardly biased. With this arrangement, a high voltage (such as a voltage close to the positive-polarity-side voltage VB of the power supply 10) is applied to the gate of the output transistor T1 via the reverse connection protection transistor MN8. Thus, the output transistor T1 is turned on. Thereby the voltage of the output terminal becomes substantially 0V. In this case, 0.7V at the node B is applied to the gate of the compensation transistor MN2. However, a gate-source voltage of the compensation transistor MN2 assumes lower than a threshold voltage thereof. Thus, the compensation transistor MN2 is turned off. In the reverse connection mode, a voltage difference between both ends of the back gate control circuit 18 assumes at most approximately 0.7V. Thus, the NMOS transistors MN9 to MN12 that constitute the back gate control circuit 18 are turned off. For this reason, the back gate voltage output from the back gate control circuit 18 assumes a value equal to or less than 0.7V generated by the parasitic diode of each of the NMOS transistors MN9 to MN12. Therefore, the voltage of the back gate of the reverse connection protection transistor MN8 is maintained at most 0.7V, the on state of the reverse connection protection transistor MN8 is maintained. Thus, the output transistor T1 is maintained to be turned on.

As described above, in the defective GND connection mode, the load driving device 3 in the third embodiment may maintain the off state of the output transistor T1 through the use of the compensation transistor MN2. In the reverse connection mode, by applying the high voltage to the gate of the output transistor T1 via the reverse connection protection transistor MN8, the output transistor T1 may be turned on. In other words, according to the load driving device 3, protection in the defective GND connection mode and protection in the reverse connection mode may be both implemented.

Fourth Exemplary Embodiment

Figure 7:
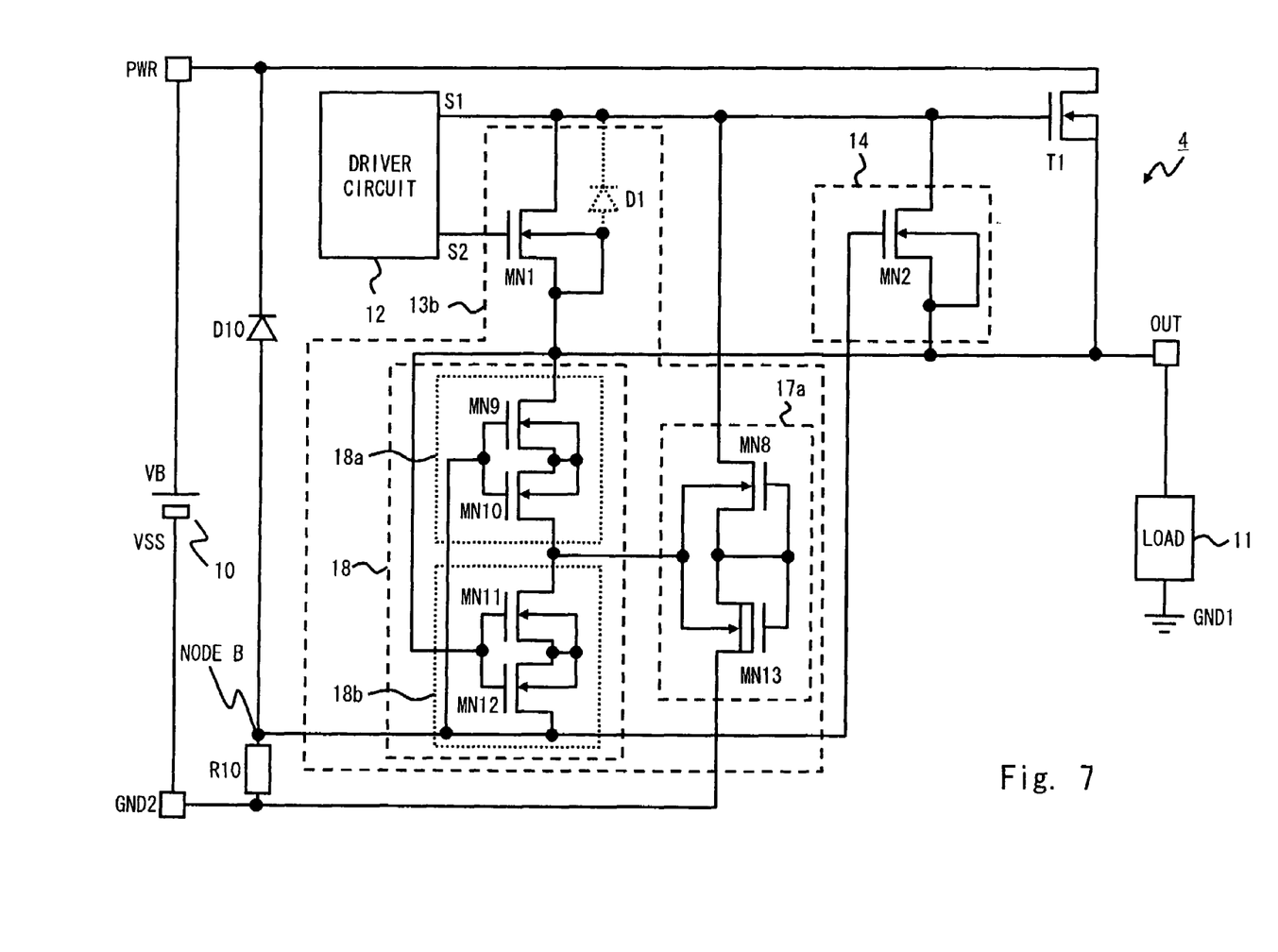
FIG. 7 is a circuit diagram of a load driving device according to a fourth exemplary embodiment of a present invention.

A circuit diagram of a load driving device 4 in a fourth embodiment will be shown in FIG. 7. As shown in FIG. 7, the load driving device 4 includes a reverse connection protection circuit 17a, which is a variation of the reverse connection protection circuit 17 in the third embodiment. A control circuit including the reverse connection protection circuit 17a in FIG. 7 is indicated by reference numeral 13b. In the load driving device 4, by assigning same reference numerals to components that are the same as those of the load driving device 3, description of the components will be omitted.

The reverse connection protection circuit 17a is obtained by adding a depletion-type NMOS transistor MN13 to the reverse connection protection circuit 17. The depletion-type NMOS transistor MN13 is connected between the reverse connection protection transistor MN8 and the ground terminal GND2. A gate of the depletion-type NMOS transistor MN13 is connected to the gate of the reverse connection protection transistor MN8, and a back gate of the depletion-type NMOS transistor MN13 is connected to the back gate of the reverse connection protection transistor MN8.

When the power supply 10 is reversely connected, the depletion-type NMOS transistor MN13 operates as a constant current source. When the depletion-type NMOS transistor 13 is not present, a large current instantaneously flows to the gate of the output transistor T1 from the ground terminal GND2 via the reverse connection protection transistor MN8. For this reason, the size of the reverse connection protection transistor MN8 in the third embodiment needs to be large so that the large current may flow therethrough. In the load driving device 4 in the fourth embodiment, however, by operating the depletion-type NMOS transistor MN13 as the constant current source, an amount of the current that flows through the reverse connection protection transistor MN8 may be controlled. With this arrangement, in the load driving device 4, the size of the reverse connection protection transistor MN8 may be designed to be smaller than that of the load driving device 3 in the third embodiment. It means that, by reducing the circuit area of the reverse connection protection transistor MN8 in the load driving device 4, the area of a chip where the load driving device is formed may be reduced.

Fifth Exemplary Embodiment

Figure 8:
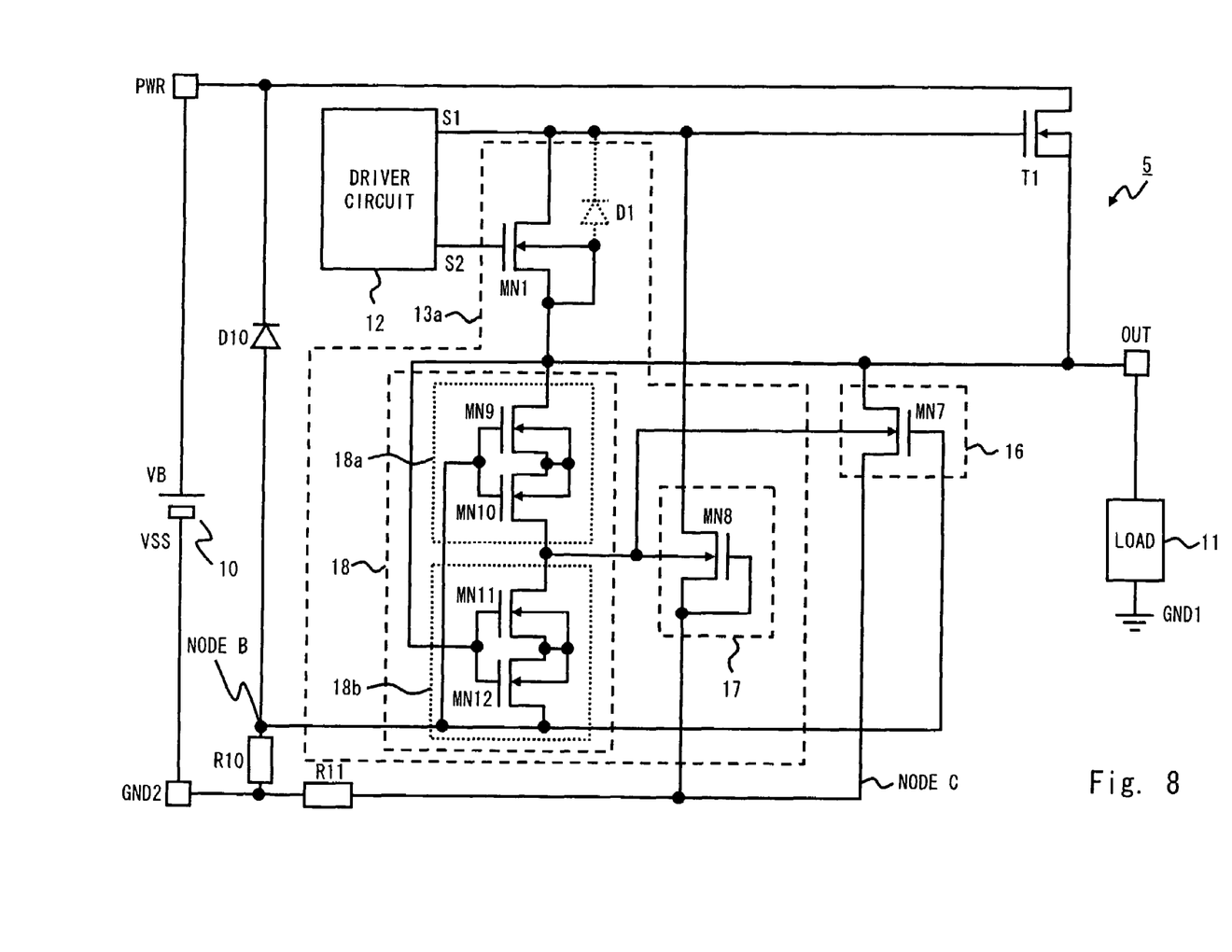
FIG. 8 is a circuit diagram of a load driving device according to a fifth exemplary embodiment of a present invention.

A circuit diagram of a load driving device 5 in a fifth embodiment will be shown in FIG. 8. As shown in FIG. 8, the load driving device 5 uses the compensation circuit 16 shown in the third embodiment in place of the compensation circuit 14 in the load driving device 3. In the load driving device 5, by assigning same reference numerals to components that are the same as those of the load driving device 3, description of the components will be omitted.

In the compensation circuit 16 in the load driving device 5, a gate of a compensation transistor MN7 is connected to the node B, a drain of the compensation transistor MN7 is coupled to the output terminal OUT, and a source of the compensation transistor MN7 is connected to the ground terminal GND2 via a resistor R11. Then, a back gate voltage is supplied to a back gate of the compensation transistor MN7 from the back gate control circuit 18. It means that, in the load driving device 5, the back gate control circuit 18 supplies the back gate voltage to each of the reverse connection protection transistor MN8 and the compensation transistor MN7.

In the following description, a node that connects the resistor R11 and the source of the compensation transistor MN7 will be referred to as a node C. In the load driving device 5, the anode side terminal of the reverse connection protection transistor MN8 is connected to the node C.

Figure 9:
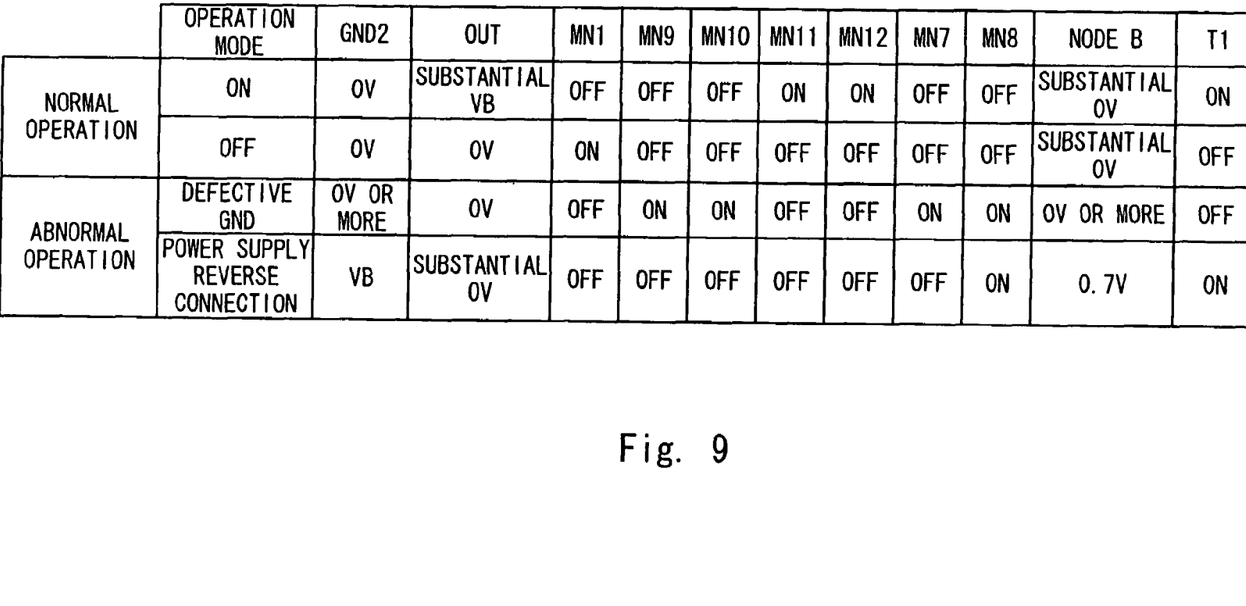
FIG. 9 is a table of the operation mode of the load drive device according to the fifth exemplary embodiment.

Next, operations of the load driving device 5 will be described. Since normal operation of the load driving device 5 is substantially the same as that of the load driving device 3, description of the normal operation will be omitted. In the defective GND connection mode in the load driving device 5, the NMOS transistors MN9 and MN10 are turned on. Thus, the back gate control circuit 18 supplies a voltage at the output terminal OUT (such as 0V) to the back gates of the reverse connection protection transistor MN8 and the compensation transistor MN7. Further, in the defective GND connection mode, a voltage at the node B rises. Thus, the compensation transistor MN7 is turned on, thereby drawing current from the ground terminal GND2. In this case, the resistor R11 limits the current that flows through the compensation transistor MN7. Moreover, since the back gate voltage of the reverse connection protection transistor MN8 is 0V, the reverse connection protection transistor MN8 is turned on. However, the compensation transistor MN7 is turned on, thereby drawing the current from the ground terminal GND2 to the output terminal OUT. Thus, no leak current flows into the gate of the output transistor T1. In other words, in the load driving device 5 as well, no leak current flows into the gate of the output transistor T1. Thus, the output transistor T1 maintains an off state.

Next, operations of the load driving device 5 in the reverse connection mode will be described. In the reverse connection mode in the load driving device 5, which is different from the reverse connection mode in the load driving device 3, the voltage at the node B is reduced using the clamp diode D10. Further, in the reverse connection mode, the back gate voltage output from the back gate control circuit 18 is 0.7V or less. For this reason, the compensation transistor MN7 is turned off. On the other hand, the reverse connection protection transistor MN8 functions as the MOS transistor that has been turned on. Accordingly, in the reverse connection mode in the load driving device 5, electric charges are supplied to the gate of the output transistor T1 through the use of the reverse connection protection transistor MN8. The output transistor T1 is thereby turned on.

The load driving device 5 shows a variation of the load driving device 3. As described above, by properly combining the configurations of the embodiments described above, protection in the defective GND connection mode and protection in the reverse connection mode may be both implemented.

The first to fifth exemplary embodiments can be combined as desirable by one of ordinary sill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A load driving device driving a load, the load driving device comprising:
   an output transistor connected between a power supply line and an output terminal;
   a control circuit connected between a gate of the output transistor and a first ground line, the control circuit controlling turning on/off of the output transistor;
   a compensation transistor that turns on when a potential of the ground line assumes a predetermined value or higher to maintain an off state of the output transistor; and
   a back gate control circuit that supplies a ground potential to a back gate of the compensation transistor when the potential of the first ground line is the ground potential, and supplies a potential at the output terminal to the back gate of the compensation transistor when a potential of a second ground line assumes the predetermined value or higher.

2. The load driving device according to claim 1, wherein the compensation transistor turns on when the output transistor is in the off state.

3. The load driving device according to claim 1, wherein voltages from a same power supply are supplied to the power supply line, and a second ground line and the first ground line, the second ground line is arranged to being coupled to the output terminal via the load, and the first and second ground lines are arranged apart from each other.

4. The load driving device according to claim 1, wherein
   the control circuit includes a discharge transistor connected between the gate of the output transistor and the first ground line; and
   the compensation transistor is connected between the gate of the output transistor and the output terminal, and a gate of the compensation transistor is connected to the first ground line.

5. The load driving device according to claim 1, wherein:
   the control circuit includes a discharge transistor with a drain thereof connected to the gate of the output transistor and a source thereof coupled to the first ground line via a resistor, and
   the compensation transistor is connected between the output terminal and the source of the discharge transistor, a gate of the compensation transistor being connected to the first ground line.

6. The load driving device according to claim 1, wherein the control circuit comprises:
   a discharge transistor connected between the gate of the output transistor and the output terminal;
   a reverse connection protection transistor that is diode-connected, a cathode side terminal of the reverse connection protection transistor being connected to the gate of the output transistor, an anode side terminal of the reverse connection protection transistor being connected to the first ground line; and
   a resistor with one end connected to the first ground line;

a protection diode with an anode thereof connected to another end of the resistor and a cathode thereof connected to the power supply line, the back gate control circuit connected between the other end of the resistor and the output terminal, the back gate control circuit controlling a back gate voltage to be supplied to a back gate of the reverse protection transistor based on a voltage difference between the other end of the resistor and the output terminal.

7. The load driving device according to claim 6, wherein the compensation transistor is connected between the gate of the output transistor and the output terminal, and a gate of the compensation transistor is coupled to the first ground line via the resistor.

8. The load driving device according to claim 6, wherein the control circuit comprises:
a depletion-type transistor connected in series with the reverse connection protection transistor between the gate of the output transistor and the first ground line; and
gates of the depletion-type transistor and the reverse connection protection transistor being connected in common, and a back gate of the depletion-type transistor and the back gate of the reverse connection protection transistor are connected in common.

9. The load driving device according to claim 6, wherein a drain of the compensation transistor is connected to the output terminal, a source of the compensation transistor is coupled to the first ground line, a gate of the compensation transistor is connected to the other end of the resistor, and the back gate voltage output from the back gate control circuit is supplied to a back gate of the compensation transistor.

10. The load driving device according to claim 1, further comprising a discharge transistor connected between the gate of the output transistor and the output terminal,
wherein a gate of the compensation transistor comprises a connection to the first ground line.

11. The load driving device according to claim 1, wherein a drain of the compensation transistor is connected to the output terminal, a source of the compensation transistor is coupled to the first ground line, a gate of the compensation transistor is connected to the first ground line through a resistor, and a back gate voltage is supplied to a back gate of the compensation transistor.

12. The load driving device according to claim 1, wherein the compensation transistor is coupled between the output terminal and the first ground line, and a gate of the compensation transistor is coupled to the first ground line.

13. The load driving device according to claim 1, wherein the compensation transistor is coupled between the gate of the output transistor and the output terminal, and a gate of the compensation transistor is coupled to the first ground line.

14. The load driving device according to claim 1, wherein the control circuit comprises a discharge transistor coupled between the gate of the output transistor and the first ground line.

15. The load driving device according to claim 1, wherein the control circuit comprises a discharge transistor coupled between the gate of the output transistor and the output terminal.

16. The load driving device according to claim 1, wherein the control circuit comprises:
a reverse connection protection transistor that is diode-connected, a cathode side terminal of the reverse connection protection transistor being coupled to the gate of the output transistor, and an anode side terminal of the reverse connection protection transistor being coupled to the first ground line.

17. The load driving device according to claim 16, wherein the back gate control circuit that supplies a ground potential to a back gate of the reverse connection protection transistor when the potential of the first ground line is the ground potential, and supplies a potential at the output terminal to the back gate of the reverse connection protection transistor when a potential of a second ground line assumes the predetermined value or higher.

18. The load driving device according to claim 17, wherein the back gate of the compensation transistor and the back gate of the reverse connection protection transistor are connected in common.

19. A load driving device driving a load, the load driving device comprising:
an output transistor connected between a power supply line and an output terminal;
a control circuit connected between a gate of the output transistor and a first ground line, the control circuit controlling turning on/off of the output transistor;
a compensation transistor that turns on when a potential of the first ground line assumes a predetermined value or higher to maintain an off state of the output transistor; and
a reverse connection protection transistor that maintains the output transistor in an on state or active state when a potential of the power supply line and the potential of the first ground line are reversely provided.

* * * * *